US008356222B2

(12) United States Patent  
Mukherjee et al.

(10) Patent No.: US 8,356,222 B2  
(45) Date of Patent: Jan. 15, 2013

(54) FAULT DIAGNOSIS FOR NON-VOLATILE MEMORIES

(75) Inventors: Nilanjan Mukherjee, Wilsonville, OR (US); Artur Pogiel, Szubin (PL); Janusz Rajski, West Linn, OR (US); Jerzy Tyszer, Poznan (PL)

(73) Assignee: Mentor Graphics Corporation, Wilsonville, OR (US)

( * ) Notice: Subject to any disclaimer, the term of this patent is extended or adjusted under 35 U.S.C. 154(b) by 260 days.

(21) Appl. No.: 12/718,822

(22) Filed: Mar. 5, 2010

(65) Prior Publication Data

US 2010/0229055 A1    Sep. 9, 2010

Related U.S. Application Data

(60) Provisional application No. 61/157,708, filed on Mar. 5, 2009.

(51) Int. Cl.  
*G01R 31/28* (2006.01)

(52) U.S. Cl. .......................... 714/733; 714/718

(58) Field of Classification Search .................. 714/42, 714/710, 732, 711, 718, 733  
See application file for complete search history.

(56) References Cited

U.S. PATENT DOCUMENTS

| 6,404,250 | B1  | 6/2002  | Volrath et al. |          |
|-----------|-----|---------|----------------|----------|
| 6,421,794 | B1  | 7/2002  | Chen et al.    |          |
| 6,519,725 | B1* | 2/2003  | Huisman et al. | 714/718  |
| 6,950,971 | B2  | 9/2005  | Boehler et al. |          |
| 7,228,468 | B2* | 6/2007  | Wu et al.      | 714/710  |
| 7,509,550 | B2* | 3/2009  | Rajski et al.  | 714/732  |
| 7,562,256 | B2* | 7/2009  | Yamauchi       | 714/42   |
| 7,571,367 | B2* | 8/2009  | Selva et al.   | 714/733  |
| 7,962,820 | B2* | 6/2011  | Rajski et al.  | 714/732  |
| 8,037,376 | B2* | 10/2011 | Anzou et al.   | 714/711  |
| 2005/0262422 | A1 | 11/2005 | Yamauchi    |          |
| 2006/0028891 | A1 | 2/2006  | Selva et al.|          |
| 2006/0064618 | A1 | 3/2006  | Wu et al.   |          |

OTHER PUBLICATIONS

D. Appello, V. Tancorre, P. Bernardi, M. Grosso, M. Rebaudengo, and M. Sonza Reorda, "Embedded memory diagnosis: an industrial workflow," Proc. ITC, paper 26.2, 2006.

S. Barbagallo, A. Burri, D. Medina, P. Camurati, P. Prinetto, and M. Sonza Reorda, "An experimental comparison of different approaches to ROM BIST," Proc. European Computer Conf., pp. 567-571, 1991.

I. Bayraktaroglu and A. Orailoglu, "The construction of optimal deterministic partitioning in scan-based BIST fault diagnosis: mathematical foundations and cost-effective implementations," IEEE Trans. Com-put., vol. 54, pp. 61-75, Jan. 2005.

T. J. Bergfeld, D. Niggemeyer, and E. M. Rudnick, "Diagnostic testing of embedded memories using BIST," Proc. Date, pp. 305-309, 2000.

J. T. Chen, J. Rajski, J. Khare, O. Kebichi, and W. Maly, "Enabling embedded memory diagnosis via test response compression," Proc. VTS, pp. 292-298, 2001.

(Continued)

*Primary Examiner* — David Ton

(57) ABSTRACT

Fault diagnosis techniques for non-volatile memories are disclosed. The techniques are based on deterministic partitioning of rows and/or columns of cells in a memory array. Through deterministic partitioning, signatures are generated for identification of failing rows, columns and single memory cells. A row/column selector or a combined row and column selector may be built on chip to implement the process of deterministic partitioning. An optional shadow register may be used to transfer obtained signatures to an automated test equipment (ATE).

23 Claims, 14 Drawing Sheets

OTHER PUBLICATIONS

J. T. Chen, J. Khare, K. Walker, S. Shaikh, J. Rajski, and W. Maly, "Test response compression and bitmap encoding for embedded memories in manufacturing process monitoring," Proc. ITC, pp. 258-267, 2001.

D. W. Clark and L.-J. Weng, "Maximal and near-maximal shift register sequences: efficient event counters and easy discrete logarithms," IEEE Trans. Comput., vol. 43, pp. 560-568, May 1994.

X. Du, N. Mukherjee, W.-T. Cheng, and S. M. Reddy, "Full-speed field-programmable memory BIST archi-tecture," Proc. ITC, paper 45.3, 2005.

J.-F. Li and C.-W. Wu, "Memory fault diagnosis by syndrome compression," Proc. Date, pp. 97-101, 2001.

G. Mrugalski, J. Rajski, and J. Tyszer, "Ring genera-tors—new devices for embedded deterministic test," IEEE Trans. CAD, vol. 23, pp. 1306-1320, Sep. 2004.

N. Mukherjee, A. Pogiel, J. Rajski, and J. Tyszer, "High throughput diagnosis via compression of failure data in embedded memory BIST," Proc. ITC, paper 3.1, 2008.

D. Niggemeyer and E. M. Rudnick, "Automatic gen-eration of diagnostic memory tests based on fault de-composition and output tracing," IEEE Trans. Com-put., vol. 53 pp. 1134-1146, Sep. 2004.

J. Rajski and J. Tyszer, "Diagnosis of scan cells in Bist environment," IEEE Trans. Comput., vol. 48, pp. 724-731, Jul. 1999.

J. Rajski, N. Tamarapalli, and J. Tyszer, "Automated synthesis of phase shifters for built-in self-test appli-cations," IEEE Trans. CAD, vol. 19, pp. 1175-1188, Oct. 2000.

N. Mukherjee, et at. "Fault Diagnosis in a Memory BIST Environment Using a Linear Feedback Shift Register," WO/2009/039316.

\* cited by examiner a)

| group | partition | | | | row address | | | | | | | | | | | | | | | | |
|---|---|---|---|---|---|---|---|---|---|---|---|---|---|---|---|---|---|---|---|---|---|
| | 0 | 1 | 2 | 3 | 0 | 1 | 2 | 3 | 4 | 5 | 6 | 7 | 8 | 9 | 10 | 11 | 12 | 13 | 14 | 15 |
| 0 | 0, 4, 8, 12 | 1, 5, 9, 13 | 2, 6, 10, 14 | 3, 7, 11, 15 | | | | x | | | | x | | | | x | | | | x |
| 1 | 0, 5, 10, 15 | 1, 4, 11, 14 | 2, 7, 8, 13 | 3, 6, 9, 12 | | | | | | | | x | | | | | | | | | b)

| group | partition | | | | row address | | | | | | | | | | | | | | | | |
|---|---|---|---|---|---|---|---|---|---|---|---|---|---|---|---|---|---|---|---|---|---|
| | 0 | 1 | 2 | 3 | 0 | 1 | 2 | 3 | 4 | 5 | 6 | 7 | 8 | 9 | 10 | 11 | 12 | 13 | 14 | 15 |
| 0 | 0, 4, 8, 12 | 1, 5, 9, 13 | 2, 6, 10, 14 | 3, 7, 11, 15 | | x | x | x | | x | x | x | | x | x | x | | x | x | x |
| 1 | 0, 5, 10, 15 | 1, 4, 11, 14 | 2, 7, 8, 13 | 3, 6, 9, 12 | | x | | | | x | | | | | x | x | | | x | x |
| 2 | 0, 6, 11, 13 | 1, 7, 10, 12 | 2, 4, 9, 15 | 3, 5, 8, 14 | | x | | | | x | | | | | x | x | | | x | |
| 3 | 0, 7, 9, 14 | 1, 6, 8, 15 | 2, 5, 11, 12 | 3, 4, 10, 13 | | | | | | x | | | | | x | x | | | | |

FIG. 1

| row address | partition | group | diffractor | offset | compact row |
|---|---|---|---|---|---|
| 0 | 10 | 11 | 11 | 10 | 0 |
| 1 | 10 | 11 | 11 | 01 | 0 |
| 2 | 10 | 11 | 11 | 00 | 1 |
| 3 | 10 | 11 | 11 | 11 | 0 |
| 4 | 10 | 11 | 01 | 01 | 0 |
| 5 | 10 | 11 | 01 | 00 | 1 |
| 6 | 10 | 11 | 01 | 11 | 0 |
| 7 | 10 | 11 | 01 | 10 | 0 |
| 8 | 10 | 11 | 10 | 11 | 0 |
| 9 | 10 | 11 | 10 | 10 | 0 |
| 10 | 10 | 11 | 10 | 01 | 0 |
| 11 | 10 | 11 | 10 | 00 | 1 |
| 12 | 10 | 11 | 11 | 00 | 1 |
| 13 | 10 | 11 | 11 | 11 | 0 |
| 14 | 10 | 11 | 11 | 10 | 0 |
| 15 | 10 | 11 | 11 | 01 | 0 |

FIG. 5

| column address | partition | group | column decoder 0 $b_0 - b_3$ | column decoder 1 $b_4 - b_7$ | observed columns |
|---|---|---|---|---|---|
| 0 | 00 | 01 | 00 | 11 | 0, 14 |
| 1 | 00 | 01 | 10 | 01 | 5, 11 |
| 0 | 01 | 01 | 01 | 10 | 2, 12 |
| 1 | 01 | 01 | 11 | 00 | 7, 9 |
| 0 | 10 | 01 | 10 | 01 | 4, 10 |
| 1 | 10 | 01 | 00 | 11 | 1, 15 |
| 0 | 11 | 01 | 11 | 00 | 6, 8 |
| 1 | 11 | 01 | 01 | 10 | 3, 13 |
| 0 | 00 | 10 | 00 | 01 | 0, 10 |
| 1 | 00 | 10 | 11 | 10 | 7, 13 |
| 0 | 01 | 10 | 01 | 00 | 2, 8 |
| 1 | 01 | 10 | 10 | 11 | 5, 15 |
| 0 | 10 | 10 | 10 | 11 | 4, 14 |
| 1 | 10 | 10 | 01 | 00 | 3, 9 |
| 0 | 11 | 10 | 11 | 10 | 6, 12 |
| 1 | 11 | 10 | 00 | 01 | 1, 11 |

(A: rows 1-8; B: rows 9-16)

| k | column diffractor initialized with the group number | | | | column diffractor initialized with the group number + 1 | | | |
|---|---|---|---|---|---|---|---|---|
| 0 | 952320 | 920576 | 888832 | 31744 | 953312 | 922560 | 892800 | 297600 |
| 1 | 95232 | 126976 | 158720 | 1015808 | 92256 | 122016 | 149792 | 527744 |
| 2 | 0 | 0 | 0 | 0 | 2976 | 2976 | 3968 | 180544 |
| 3 | 1024 | 0 | 0 | 0 | 32 | 992 | 1984 | 31744 |
| 4 |  | 1024 | 0 | 0 |  | 32 | 0 | 4960 |
| 5 |  |  | 1024 | 0 |  |  | 32 | 3968 |
| 8 |  |  |  | 0 |  |  |  | 992 |
| 16 |  |  |  | 0 |  |  |  | 992 |
| 32 |  |  |  | 1024 |  |  |  | 32 |

FIG. 13

FAULT DIAGNOSIS FOR NON-VOLATILE MEMORIES

RELATED APPLICATIONS

This application claims priority to U.S. Provisional Patent Application No. 61/157,708, entitled "Fault Diagnosis For Embedded Read-Only Memories," filed on Mar. 5, 2009, and naming Nilanjan Mukherjee, et al. as inventors, which application is incorporated entirely herein by reference.

FIELD OF THE INVENTION

The present invention is directed to fault diagnosis for memory arrays. Various aspects of the invention may be particularly useful for identifying faulty rows, columns, and cells in non-volatile memories.

BACKGROUND OF THE INVENTION

The International Technology Roadmap for Semiconductors predicts memories to occupy more than 90% of the chip silicon area in the foreseeable future. Due to their ultra large scale of integration and vastly complex structures, memory arrays are far more vulnerable to defects than the remaining parts of integrated circuits. Embedded memories have already started introducing new yield loss mechanisms at a rate, magnitude, and complexity large enough to demand major changes in test procedures. Many types of failures, often not seen earlier, originate in the highest density areas of semiconductor devices where diffusions, polysilicon, metallization, and fabricated structures are in extremely tight proximity to each other. Failing to properly test all architectural features of the embedded memories can eventually deteriorate the quality of test, and ultimately hinder yield.

Embedded memories are clearly more challenging to test and diagnose than their stand-alone counterparts. This is because their complex structures are paired with a reduced bandwidth of test channels resulting in limited accessibility and controllability. Consequently, the memory built-in self-test (MBIST) has quickly established itself as one of the mainstream design for test (DFT) methodologies as it allows one to generate, compress, and store on chip very regular test patterns and expected responses by using a relatively simple test logic. The available input/output channels, moreover, suffice to control BIST operations, including at-speed testing and detection of time-related faults.

Non-volatile memories are among the oldest programmable devices, but continue to have many critical uses. ROM, PROM, EPROM, EEPROM, and flash memories have proved to be very useful in a variety of applications. Traditionally, they were primarily used for long term data storage, such as look-up tables in multi-media processors or permanent code storage in microprocessors. Due to the high area density and new submicron technologies involving multiple metal layers, ROMs have also gained popularity as a storage solution for low-voltage/low-power designs. Moreover, different methods such as selective pre-charging, minimization of non-zero items, row(s) inversion, sign magnitude encoding, and difference encoding are being employed to reduce the capacitance and/or the switching activity of bit and word lines. Such design, technology, and process changes have resulted in an increase in the number of ROM instances usually seen in a design. New non-volatile memories such as ferroelectric, magnetoresistive, and phase changed RAMs retain data when powered off but are not restricted in the number of operation cycles. They may soon replace other forms of non-volatile memory as their advantages, e.g., reduced standby power and improved density, are tremendous.

It has become imperative to deploy effective means for testing and diagnosing non-volatile memory failures. No longer is it sufficient to determine whether such a memory failed or not. In defect analysis and fine-tuning of a fabrication process, the ability to diagnose the cause of failure is of paramount importance. In particular, new defect types need to be accurately identified and well understood. It is also a common desire to verify if the programming device that is writing the ROM is working correctly. The method and accuracy of the diagnostic technique, therefore, is a critical factor in identifying failing sites of a memory array. It can be performed either on chip or off-line after downloading compressed test results.

BRIEF SUMMARY OF THE INVENTION

Aspects of the invention relate to fault diagnosis for memory arrays. According to various embodiments of the invention, rows and/or columns of a non-volatile memory array are partitioned deterministically to generate signatures. The resultant signatures may be used to identify failing rows, columns, and cells in the non-volatile memory array. The deterministic partitioning may be implemented by a row selector and/or column selector in addition to a BIST controller.

BRIEF DESCRIPTION OF THE DRAWINGS

FIG. 1 illustrates two examples of determining failing rows with signatures obtained through deterministic partitioning of rows in a memory array according to some embodiments of the invention.

FIG. 5 illustrates an operation of a row selector according to some embodiments of the invention.

FIG. 13 illustrates row-column correlation in the Trellis mode and a solution to reducing it.

DETAILED DESCRIPTION OF THE INVENTION

Figure 2:
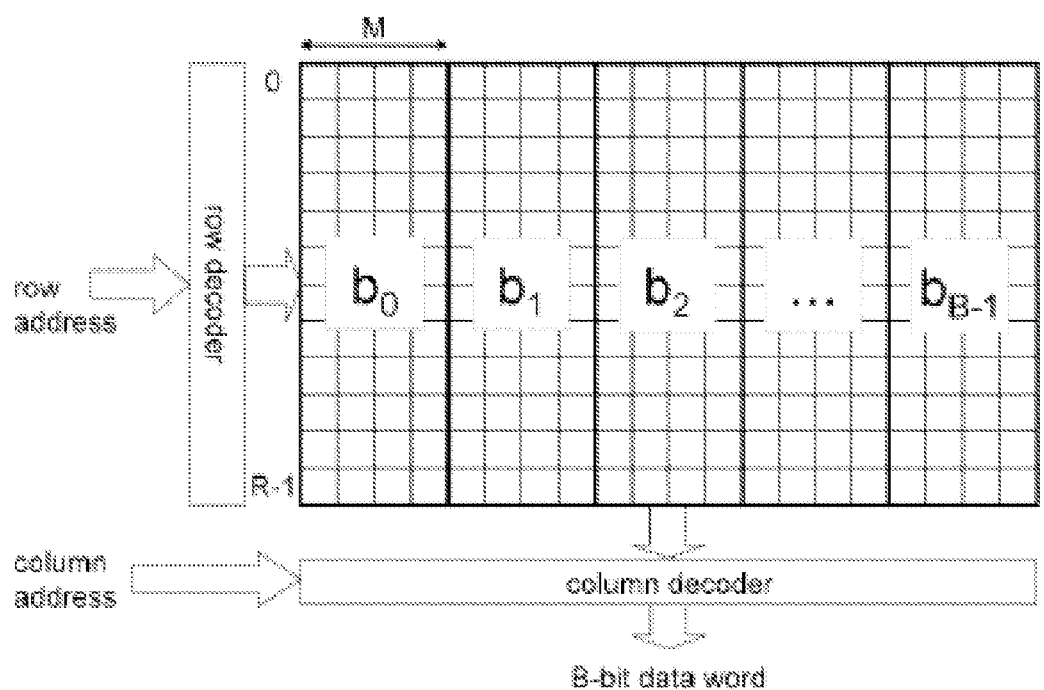
FIG. 2 illustrates architectural features of a non-volatile memory array.

Various aspects of the present invention relate to techniques for identifying failing rows, columns, and cells in a non-volatile memory array. In the following description, numerous details are set forth for purpose of explanation. However, one of ordinary skill in the art will realize that the invention may be practiced without the use of these specific details. In other instances, well-known features have not been described in details to avoid obscuring the present invention. Some of the disclosed techniques may be implemented as part of an electronic design automation (EDA) tool.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine" and "generate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire microdevice, however, such as a portion of an integrated circuit device. Still further, the term "design" also is intended to encompass data describing more than one microdevice, such as data to be used to form multiple microdevices on a single wafer.

Deterministic Partitioning

Fault diagnosis for memories usually has a simple flow. It may proceed iteratively by determining a signature which corresponds to the selected rows and columns of a memory array, followed by a transfer of such data to an automated test equipment (ATE) through an optional shadow register. If the obtained signature matches the reference (golden) signature, the selected rows and/or columns are declared to be fault-free.

Various embodiments of the invention employ deterministic partitioning to generate signatures. For example, rows or columns may be decomposed into a group of $2^n$ disjoint partitions of approximately same size, where $n=\lceil 0.5 \log_2 v \rceil$, $v$ is the total number of rows or columns and $\lceil z \rceil=$ceiling(z) (i.e. the smallest integer not less than z). Subsequently, different groups of partitions are formed such that each partition of a given group shares at most one item with every partition belonging to the remaining groups. A signature is obtained for a partition by processing data from rows or columns belonging to the partition. When a memory array has x failing elements, a test with x+1 groups of partitions may be sufficient to uniquely determine the failing items. This makes tracking down of failing rows or columns time-efficient. Here, the number x may be estimated based on dependent defect density distribution or experience.

Consider, for example, a 16-row memory array. Four groups, each comprising four unique partitions, are shown in FIG. 1a. Suppose row 7 is faulty. After producing four signatures for the first group (group 0), it appears that signatures representing partitions 0, 1, and 2 are error-free, thereby rows that belong to these partitions can be cleared (the right-hand side of FIG. 1a). Since a signature obtained by processing data from rows 3, 7, 11, and 15 (partition 3) is erroneous, these rows become suspects (as marked in FIG. 1a). Under the partitioning scheme, the suspect rows will appear in different partitions in the subsequent group. In this example, the signature for partition 2 of the second group (group 1) shows an error. By comparing the row addresses for partition 3 in group 0 with those for partition 2 in group 1, the failing row (row 7) can be easily isolated. Because there is only one failing row, i.e. x=1, two (x+1=2) groups of partitions are sufficient to locate the failing row.

FIG. 1b illustrates another example. There are 3 failing rows (5, 10, 11) in this case, i.e. x=3. Accordingly, a test with x+1=4 groups of row partitions is needed to identify the failing rows. As shown in FIG. 1b, signatures for partitions 1, 2, 3 of group 0, partitions 0, 1 of group 1, partitions 0, 1 of group 2, and partitions 2, 3 of group 3 show errors. By comparing row addresses for these partitions, only rows 5, 10 and 11 appear in each group's suspect partitions. Therefore, these rows are considered to be the failing TOWS.

The fault diagnosis may be performed either in a non-adaptive mode where tests are selected prior to the actual diagnostic experiment, or in an adaptive fashion, where selection of tests is based on the outcomes of the previous runs. In the first case, the process targets a pre-specified number x of failing items and does not require any interaction with a tester, as only signatures for x+1 groups of partitions need to be collected. In the second approach, the number of common suspect rows or columns is determined every time after obtaining signatures for a new group of partitions. If the number does not decrease, the failing items are assumed to be identified, and the test stops.

Architecture of a Test Environment

FIG. 2 illustrates architectural features of a non-volatile memory array. The array has R rows. Every row consists of M words, each B-bit long. The array has C columns, where $C=B \times M$. Bits belonging to one word can be either placed one after another or be interleaved forming segments as illustrated in the figure. Decoders guarantee the proper access to memory cells in either a fast row or a fast column addressing mode, i.e., with row numbers changing faster than column numbers or vice versa. It is worth noting that algorithms according to various aspects of the present invention do not impose any constraints on the addressing scheme so that either a fast row or a fast column addressing mode works. The memory array can also be read using either increasing or decreasing address order.

Figure 3:
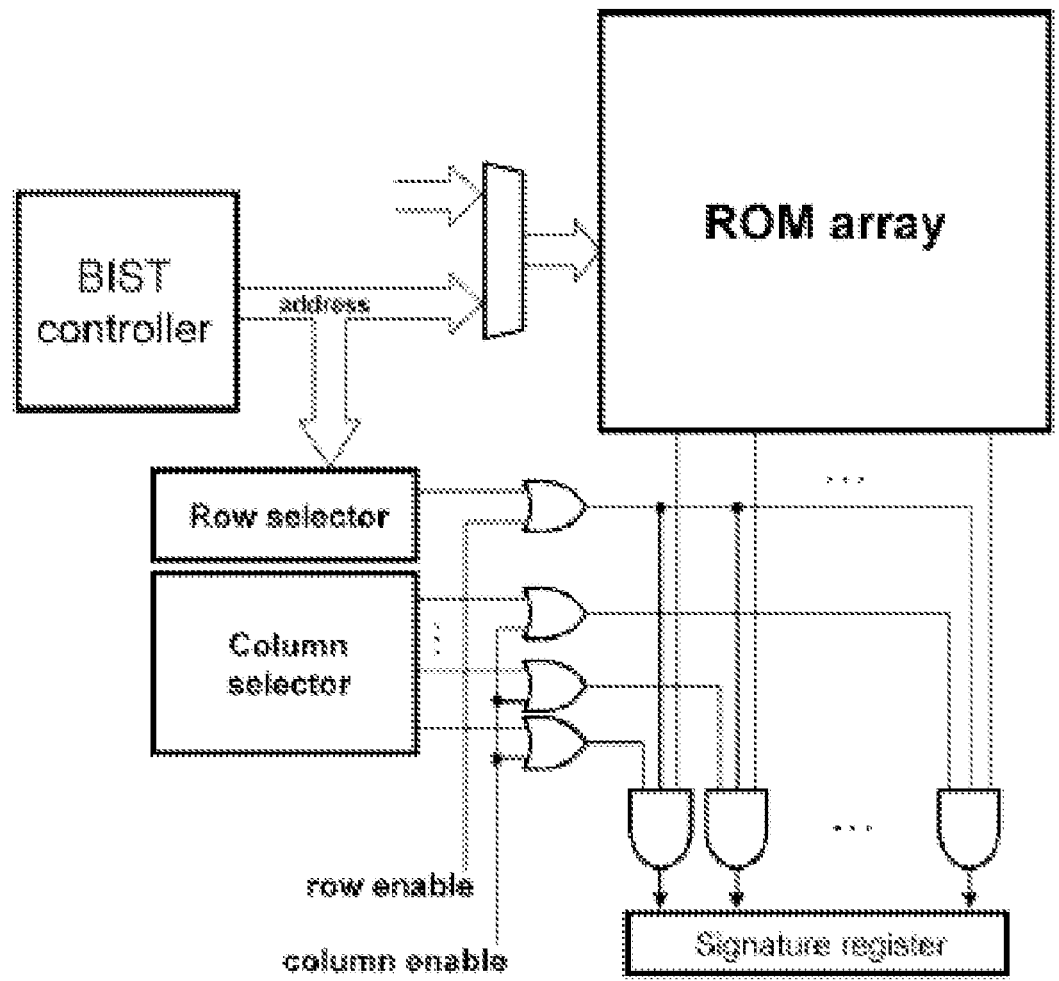
FIG. 3 illustrates the architecture of a test environment used to collect diagnostic data from a non-volatile memory array according to some embodiments of the invention.

FIG. 3 summarizes the architecture of a test environment used to collect diagnostic data from a non-volatile memory array according to some embodiments of the invention. Failures are assumed to be permanent and address independent. In addition to a BIST controller, the test structure consists of two modules and gating logic that allow selective observation of rows and columns, respectively. The BIST controller sweeps through all memory addresses repeatedly while the row and column selectors decide which data arriving from the memory rows and/or columns is actually observed by the signature register. Depending on a test scenario, test responses are collected in one of the following test modes: 1) Row enable=0 & column enable=1—the row selector enables all bits of the currently received word, thereby selecting a given row; this mode is used to diagnose rows and single cells; 2) row enable=1 & column enable=0—assertion of the row enable signal effectively disables the row selector; the column selector takes over as it picks a subset of bit lines to be observed (this action corresponds to selecting desired columns); and 3) row enable=0 & column enable=0—de-asserting both control lines allows observation of memory cells located where selected rows and columns intersect.

Row Selection

Figure 4:
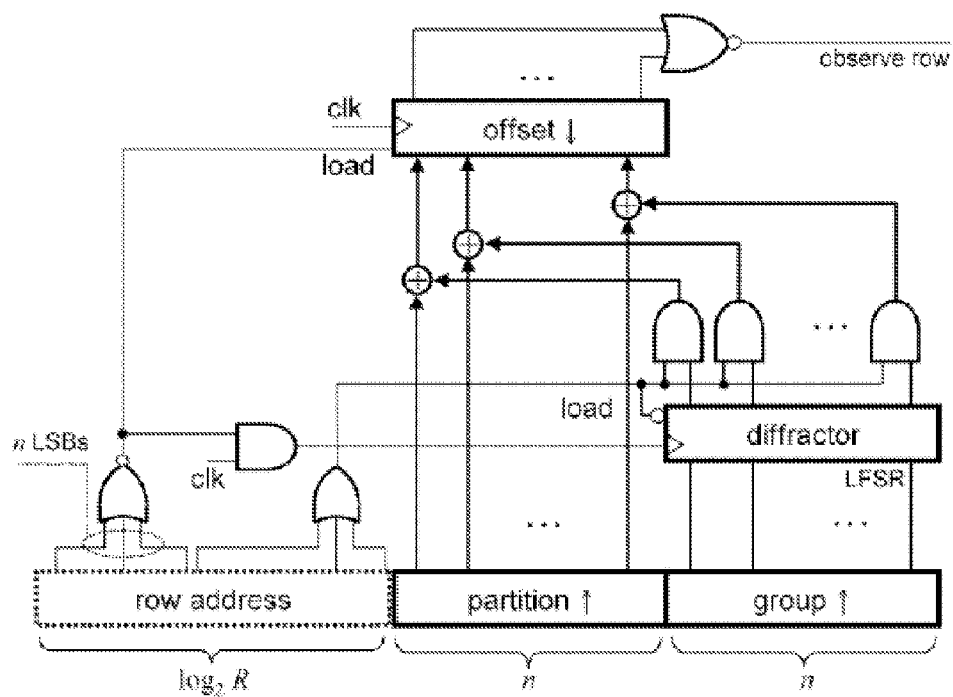
FIG. 4 illustrates an example of a row selector.

FIG. 4 shows an example of a row selector. Essentially, it is comprised of four registers. The up counters for partitions and groups, each of size $n=\lceil 0.5 \log_2 R \rceil$, keep indexes of the current partition and the current group, respectively. They act as an extension of the row address register that belongs to the BIST controller (the leftmost part of a counter in FIG. 4). A linear feedback shift register (LFSR) with a primitive characteristic polynomial implements a diffractor providing successive powers of a generating element of GF($2^n$), which are subsequently used to selectively invert data arriving from the partition register. The same register has the ability to load parallel data when its input load is de-asserted. Finally, the offset register is a down counter initialized every time its input load is asserted.

In principle, the circuit of FIG. 4 implements the following formula used to designate members of a successive partition p within a given group g:

$$r = S \cdot k + (p \oplus (g \otimes k)), k=0,1,\ldots,P-1$$

where S is the size of partition, P is the number of partitions, $\oplus$ is a bit-wise addition modulo 2, and $g \otimes k$ is an LFSR state reachable after k−1 steps following its initialization with the value of g. If k=0, then $g \otimes k = 0$. As can be easily verified, the above equation yields successive partitions of FIG. 1 for S=4 and k=0, 1, 2, 3, assuming that the diffractor state trajectory is 1→2→3→1. For instance, for g=2 and p=1, the selected row numbers are:

$$k=0: r = 4 \cdot 0 + (1 \oplus (2 \otimes 0)) = 0 + (1 \oplus 0) = 1$$

$$k=1: r = 4 \cdot 1 + (1 \oplus (2 \otimes 0)) = 4 + (1 \oplus 2) = 7$$

$$k=2: r = 4 \cdot 2 + (1 \oplus (2 \otimes 2)) = 8 + (1 \oplus 3) = 10$$

$$k=3: r = 4 \cdot 3 + (1 \oplus (2 \otimes 3)) = 12 + (1 \oplus 1) = 12$$

With the ascending row address order, selection of rows within a partition, a group, and finally the whole test is done as follows. The offset counter is reloaded periodically every time the n least significant bits of the row address register become zero (this is detected by the left side NOR gate). Once loaded, the counter is decremented to reach the all-0 state after $p \oplus (g \otimes k)$ cycles. This is detected by the top NOR gate. Hence, its asserted output enables observation of a single row within every S successive cycles. As indicated by the formula, the initial values of the offset counter are obtained by adding the actual partition number to the current state of the diffractor. The latter register is initialized by using the group number at the beginning of every test run, i.e., when the row address is reset. Subsequently, the diffractor changes its state every time the offset register is reloaded. As the period of the LFSR-based diffractor is $2^n-1$, and the offset counter is reloaded $2^n$ times, the missing all-0 state is always generated at the beginning of a test run by means of the AND gates placed at the outputs of the diffractor.

FIG. 5 illustrates, according to some embodiments of the invention, an operation of a row selector for the memory of FIG. 1, i.e., for 16 rows forming 4 partitions (n=2). Successive entries to the table in FIG. 5 correspond to values occurring in the selector registers when handling partition 2 of group 3. The bold numbers indicate time frames when the diffractor and the offset counter are reloaded with new values. As can be seen, the diffractor is loaded at the beginning of a test run with the group number 3 ($11_2$), and then it changes its state every 4 cycles by following the trajectory 1→2→3. At the same cycles, the offset counter is reloaded with the sum of the partition number 2 ($10_2$) and the previous state of the diffractor, except for the first load, when only the partition number goes to the offset counter. After initializing, the offset register counts down and reaches zero at cycles 2, 5, 11, and 12 which results in compacting data from the memory rows with addresses 2, 5, 11, and 12, respectively.

Column Selection

Figure 6:
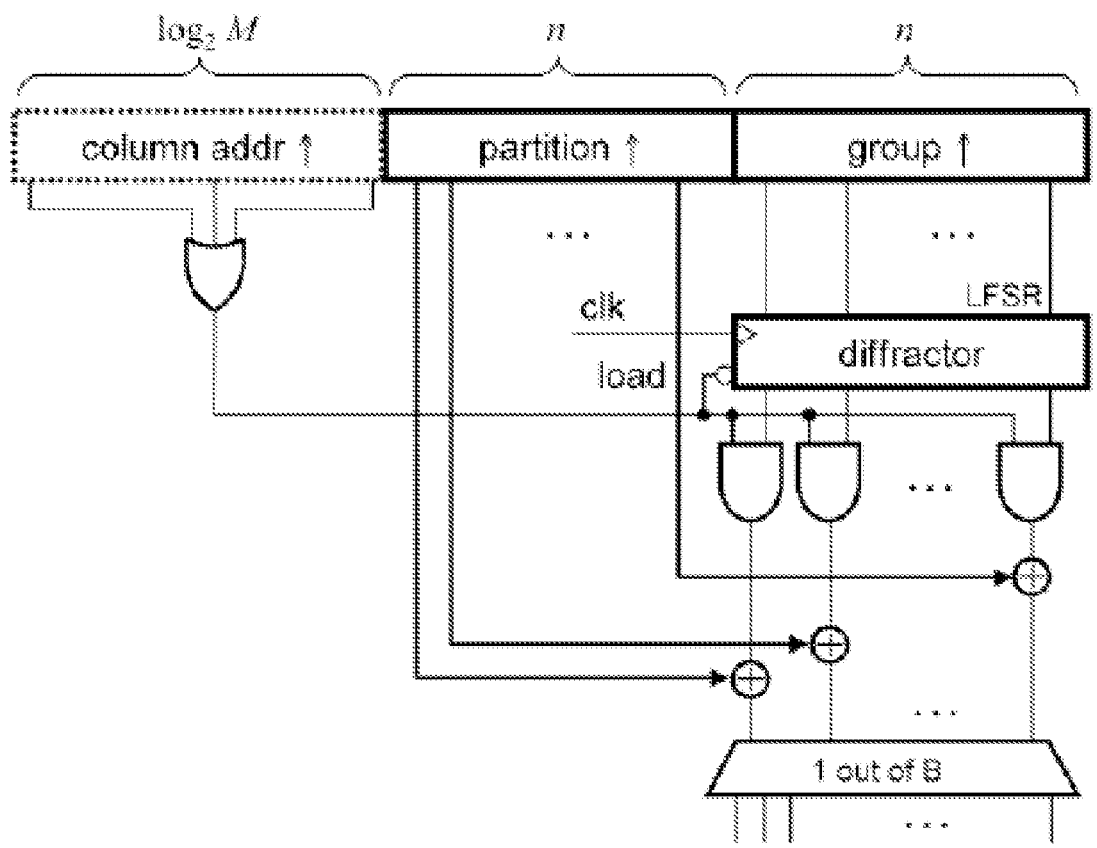
FIG. 6 illustrates a column selector according to some embodiments of the invention.

FIG. 6 shows, according to some embodiments of the invention, a column selector used to decide, in a deterministic fashion, which columns should be observed. Its architecture resembles the structure of the row selector, as both circuits adopt the same selection principles. The main differences include the use of a BIST column address register and a new diffractor clock gating scheme. Moreover, the offset counter is now replaced with a combinational column decoder which allows selection of one out of B outputs of the column decoder (see FIG. 3). It is worth noting that the diffractor advances every time the column address increments. Its content added to the partition number yields a required column address in a manner similar to that of the row selection.

If the size B of the memory word is equal to M (the number of words per row), it suffices to select one out of B columns at a time to cover all columns of the memory array for one partition group. Typically, however, we observe that B>M. This requires more than one column of each word to be selected at a time, as far as the single test run is concerned for every partition. The number $\tau$ of columns compacted simultaneously can be determined by dividing the maximal number of columns in a partition, which is $2^n$, by the number M of memory words per row: $\tau = 2^n/M$.

Figure 7:
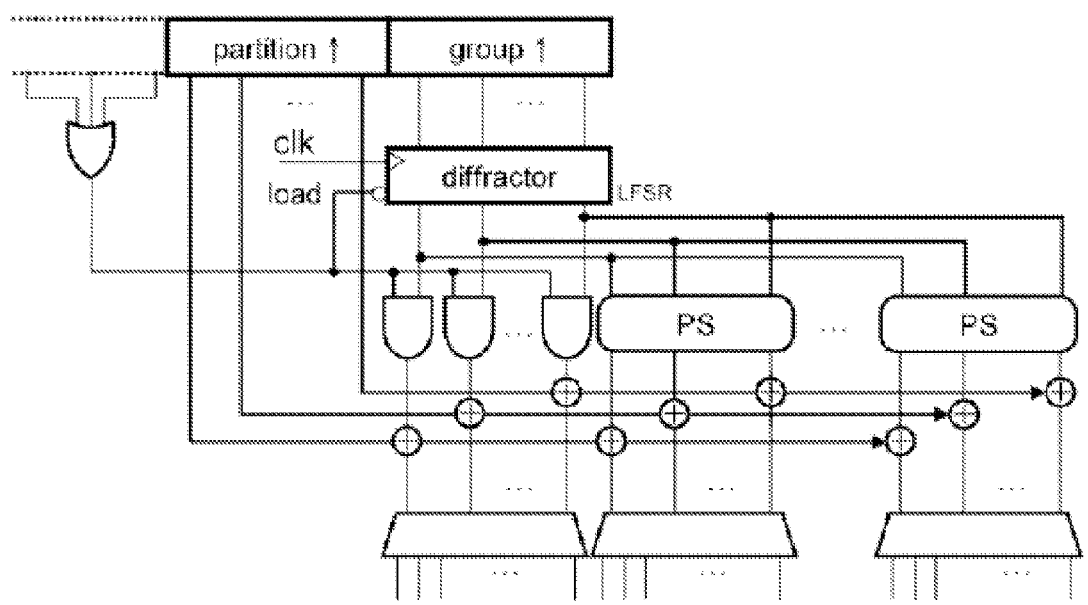
FIG. 7 illustrates a column selector including phase shifters according to some embodiments of the invention.
Figure 8:
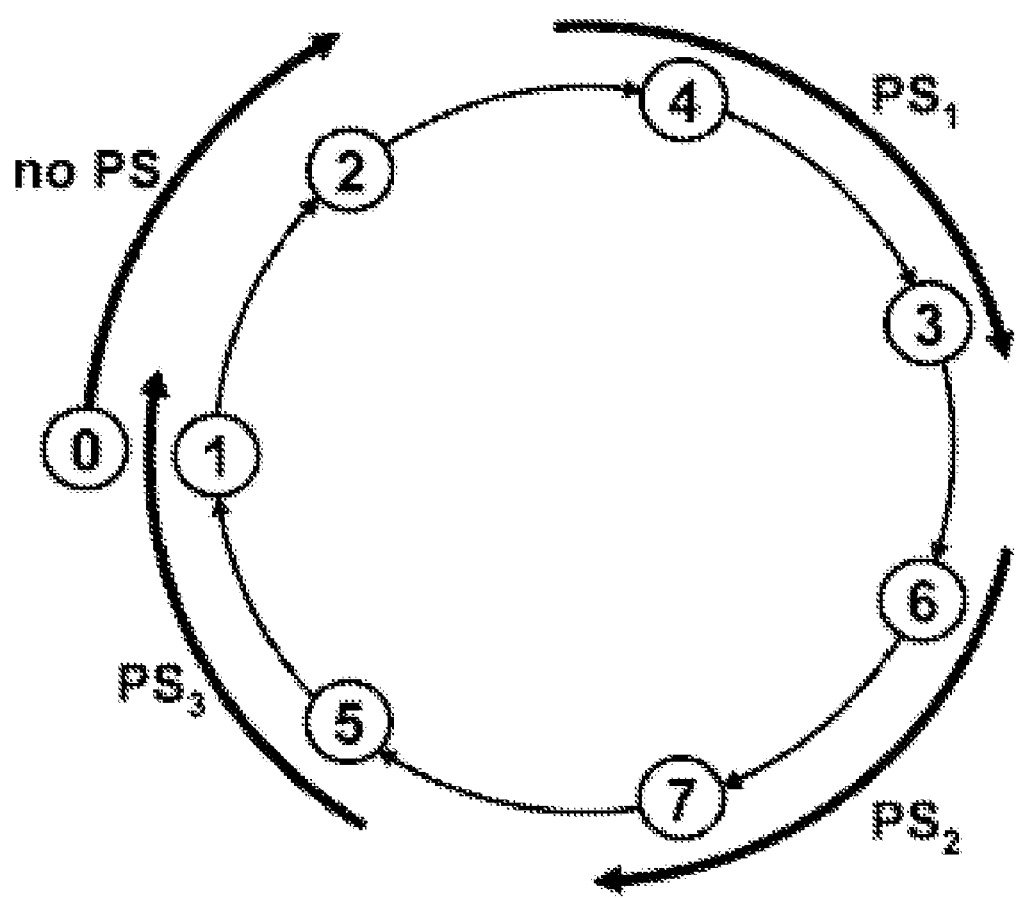
FIG. 8 illustrates a use of three phase shifters.

It is important to note that columns compacted in parallel cannot be handled by a single "$\tau$ out of B" selector, as in such a case certain columns would always be observed together, thereby precluding an effective partitioning. Consequently, the output column decoder is divided into $\tau$ smaller "1 out of $B/\tau$" decoders fed by phase shifters (PS), and then the diffractor, as shown in FIG. 7. The phase shifters transform a given input combination such that the resultant output values are spread in regular intervals over the diffractor trajectory. FIG. 8 demonstrates this scenario for a 3-bit diffractor driving three phase shifters and using primitive polynomial $x^3+x+1$. Let the diffractor be initialized to the value of 1. The phase shifters $PS_1$, $PS_2$, and $PS_3$ are then to output states of the original trajectory, but starting with the values of 4, 6, and 5, respectively. When various partition groups are examined, the diffractor traverses the corresponding parts of its state space while the phase shifters produce appropriate values that ensure generation of all $2^n-1$ combinations. The missing all-0 state is again obtained by means of AND gates. Synthesis of phase shifters is thoroughly discussed in J. Rajski, et al., "Automatic generation of diagnostic memory tests based on fault decomposition and output tracing," IEEE Trans. Comput., vol. 53 pp. 1134-1146, September 2004, which is incorporated herein by reference.

Figure 9:
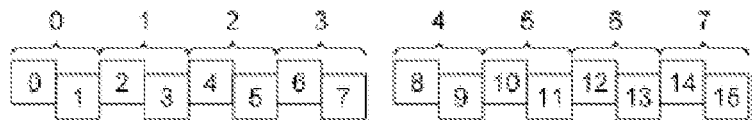
FIG. 9 illustrates column partitioning according to some embodiments of the invention.
Figure 9:
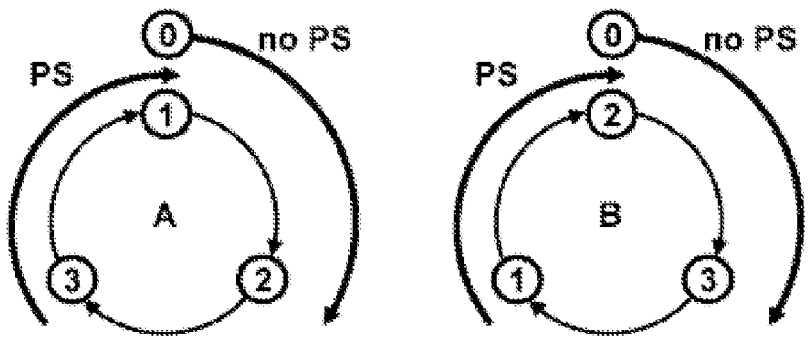

FIG. 9 shows an example. A memory row consists of two 8-bit interleaved words arranged as shown at the top of FIG. 9. $\tau = 4/2 = 2$, so there is a need for two "1 out of 4" column decoders and one phase shifter connected to the decoder selecting bits b4 to b7. The table of FIG. 9 illustrates how columns are selected for partition groups 1 ($01_2$) and 2 ($10_2$). The first two rows of the table contain values generated by the diffractor (initialized with the group number 1) and a phase shifter for partition 0. As can be seen, despite the diffractor's initial value, address 0 is first observed at the input of column decoder 0 due to the logic value of 0 driving the AND gates. The next state provided to the column decoder is 2, which is the second state produced by the diffractor. These two addresses at column decoder 0 result in the following selections: column 0 of word 0, and column 5, which, in fact, is the column 2 of word 1. Moreover, column decoder 1 receives states 3 and 1 produced by the phase shifter (see the corresponding diffractor trajectories). They facilitate selection of columns 14 and 11, respectively. As for the remaining partitions of group 1, the same states occur at the outputs of AND gates and the phase shifter, but they are further modified by adding successive partition numbers. It effectively results in selection of the remaining columns. Column selection for the next partition groups is carried out in a similar manner except for initialization of the diffractor. The diffractor trajectory and selection of columns for partition group 2 are presented in FIG. 9.

Signature Register

Figure 10:
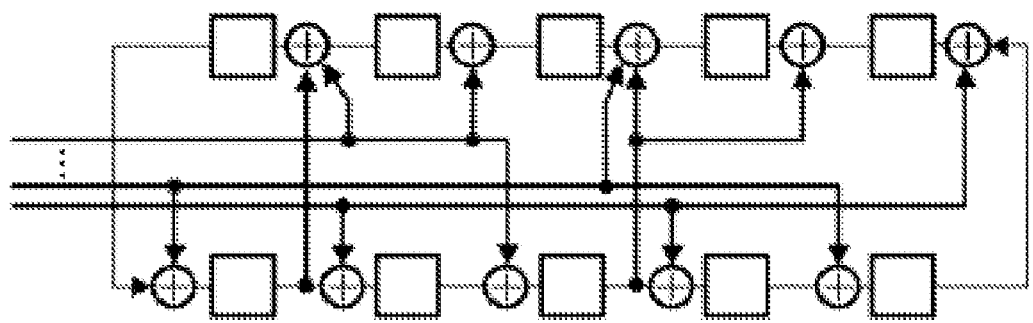
FIG. 10 illustrates a MIRG-based signature register according to some embodiments of the invention.

A signature register may be used to collect test responses arriving from selected memory cells according to some embodiments of the invention. The register may be reset at the beginning of every run (test step) over the address space. Similarly, the content of the register may be downloaded once per run. In some embodiments of the invention, a ring generator with multiple inputs (MIRG) driven by the outputs of gating logic is used to implement the signature register. The design of FIG. 10 features the injector network handling the increasing number of input channels. It is worth noting that connecting each input to uniquely selected stages of the compactor makes it possible to recognize errors arriving from different input channels. This technique visibly improves diagnostic resolution. It should be appreciated that some types of linear feedback shift registers (LFSR), such as LFSR (internal XOR), LFSR (external XOR), and LFSR (cellular automation), may also be used to implement the signature register.

Combined Rows And Columns Selection

Figure 11:
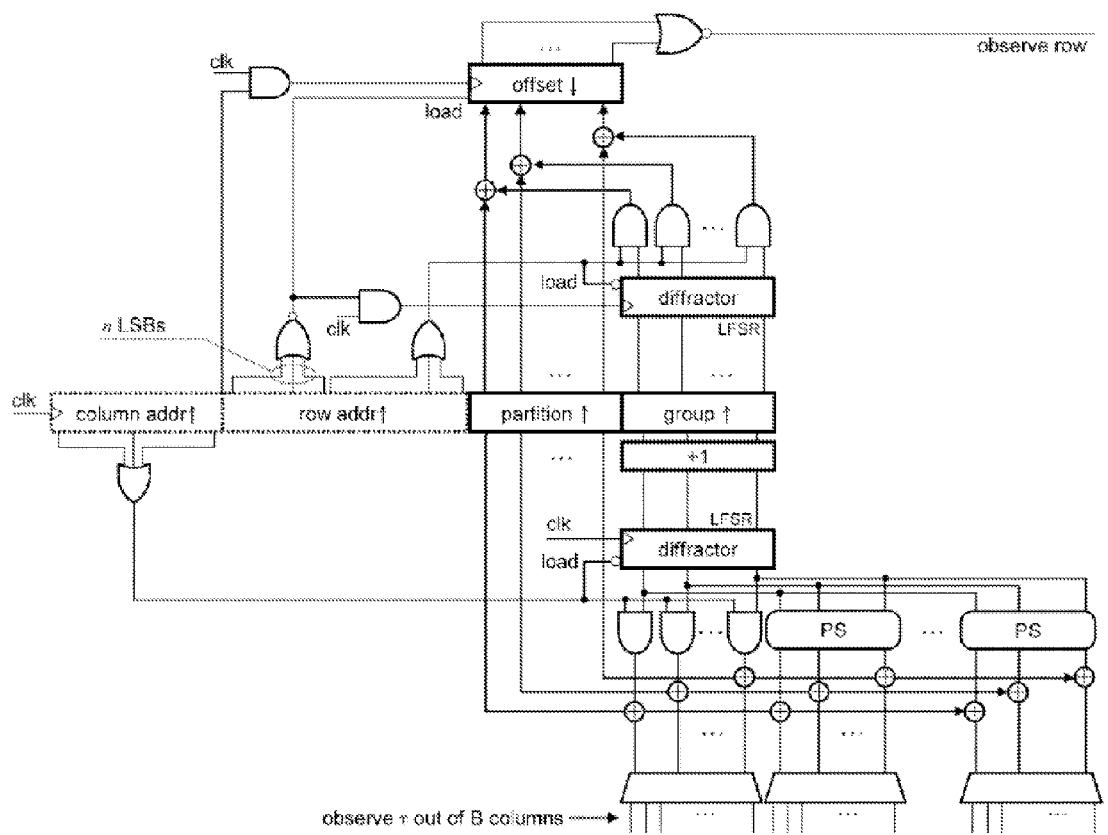
FIG. 11 illustrates a combined row and column selector according to some embodiments of the invention.

According to some embodiments of the invention, some components of the row selector and the column selector may be shared. The circuit by which this concept is implemented is shown in FIG. 11 where the partition and group registers feed both selectors. Since the column address increments prior to the row address, the memory array is read in the fast column addressing mode. As no interaction between control signals arriving from the column and row address registers is needed, the scheme enables reading the memory array in the fast row mode as well, after exchanging the row and column address registers. Furthermore, the combined row and column selector is designed in such a way that none of the components require clock faster than the one used to increment either the column or row address register. As a result, the proposed scheme allows reading memory at-speed, and thus detection of time-related faults. Finally, as the combined selector makes it possible to collect the row and column signatures in parallel, such an approach allows one to reduce the diagnostic time by half. In this mode, however, two signature registers are required.

Trellis Selection

Figure 12:
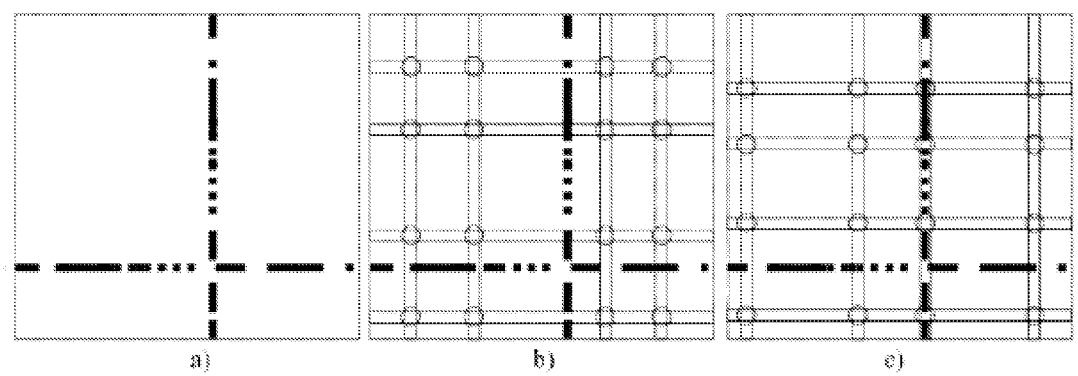
FIG. 12 illustrates Trellis selection.

Given x+1 groups of signatures, the selection schemes presented above may allow one to correctly identify up to either x failing rows or x failing columns. The actual failure may comprise, however, faults occurring in rows and columns at once. FIG. 12a illustrates a failure that consists of a single stuck-at column and a single stuck-at row. The black dots indicate failing cells assuming a random fill—note that some cells of the faulty row and column store the same logic values as the one forced by the fault. If diagnosed by using separate selection of rows and columns, such a fault would affect most of signatures as cells belonging to the failing column make almost all row signatures erroneous, and cells of the failing row would render almost all column signatures erroneous, as well.

Collecting signatures in so-called trellis mode provides a solution to this problem by partitioning rows and columns simultaneously. By doing so, the number of observed cells is substantially reduced, thereby increasing a chance to record fault-free signatures and to sieve successfully failing rows and columns. FIGS. 12b and 12c are examples of trellis compaction in the presence of a single-row-single-column failure. Observed cells are memory cells located at the intersections of rows and columns only. The resultant signatures are therefore likely to be error-free, as shown in FIG. 12b. Consequently, the selected rows and columns can be declared fault free. When the selected cells come across the failing row or the failing column, one may expect to capture at least one error, as in FIG. 12c.

There is an intrinsic rows-to-columns correlation in the trellis selection mode. In particular, using the same characteristic polynomial for both diffractors of FIG. 11, and initializing them with the same group number causes predictable changes in this dependency—many row-column pairs end up always in the same partitions. As a result, the diagnostic algorithm is unable to distinguish fault-free rows and columns from defective ones since they are permanently paired by the selection scheme. FIG. 13 illustrates a possible impact this phenomenon may have on diagnostic quality. The results were obtained for a memory array with 1024 rows and 1024 columns. The row and column selectors employ identical diffractors with a primitive polynomial $x^5+x^2+1$. Each entry to the table in Fig. provides the number of row-column pairs (out of total $1024^2$) that occur k times within the same partitions for arbitrarily chosen 3, 4, 5, and 32 partition groups. As shown in the table, 1024 rows and columns get always to the same partition regardless of the number of partition groups. A thorough analysis of these results has further revealed that every row is permanently coupled with a certain column due to this particular selection mechanism.

It appears, however, that a simple n-bit arithmetic incrementer (a module labeled "+1" in FIG. 11) placed between the group register and one of the diffractors may alter this fundamental row-column relationship so that the resultant correlation is significantly decreased. This is confirmed by experimental data gathered in the second part of the table in FIG. 13. The column diffractor of FIG. 11 is assumed to be initialized with the group number increased arithmetically by 1. As can be seen, the enhanced selection technique clearly reduces the number of the row-column pairs that always end up in the same partitions. Interestingly, the number of such pairs is equal to the number of partitions in a group (32). This is due to the zero state that is always contributed by the AND gates at the beginning of each partition.

Single Cell Failures

The selection methods presented in the previous section allow identification of failing sites with single-row and/or single-column accuracy. It is also possible to take diagnosis a step further and determine location of a single faulty cell within a row or a column.

Figure 14:
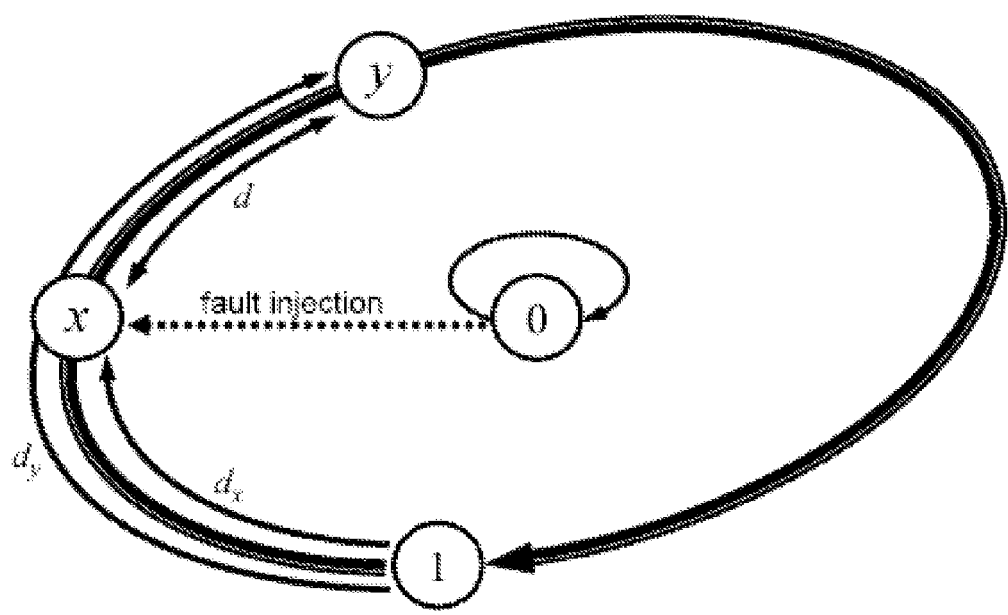
FIG. 14 illustrates single cell failure diagnosis according to some embodiments of the invention.

Since the compactor (signature register) is a linear circuit, so-called error signature E may be used, which conveniently replaces the actual signature A, and can be obtained by adding modulo 2 a golden (fault-free) signature G to A, i.e., $E=A\oplus G$. In terms of error signatures, the compactor remains in the all-0 state (FIG. 14) till a fault injection that moves the compactor to a certain state x determined by the compactor injector network. Subsequently, the compactor advances by additional d steps to reach state y. Typically, d is the number of steps required to complete a given memory run. The same value provides then the actual fault location which is a distance between states x and y, as recorded by the compactor.

The value of d, and hence a fault site, can be found by using a discrete logarithm-based counting. It solves the following problem: given an LFSR and its particular state, determine the number of clock cycles necessary to reach that state assuming that the compactor is initially set to 0 . . . 001. Since a fault injection site (the compactor input) is unknown, d must be computed B times by using repeatedly the following formula: $d=d_y-d_x$, where $d_y$ and $d_x$ are distances between the state 0 . . . 01 and states x and y, respectively. Recall that state x depends on where a fault is injected, so does $d_x$. Finally, only d<M·R is considered an acceptable solution. It is worth noting that once accepted, the corresponding state x identifies uniquely the memory segment from which a fault arrives.

Information related to failing rows (or columns), obtained as shown in the earlier sections, is used in further efforts to improve accuracy of diagnosis. Given distance d, one can easily determine a row r to which the suspect cell belongs. If r does not match the row indicated by virtue of the way the selection mechanism works, the algorithm continues to target the following memory segments. The same technique allows scaling down the size of the compactor itself. In fact, the compactor period can be shortened even below the size of a single memory segment. A possible "wrap-around" is effectively counterbalanced here by failing row information used to eliminate inconsistent results.

In some embodiments of the invention, row selection scheme, column selection scheme, and Trellis selection scheme can work together or in any combinations. While adding hardware cost compared to a single selection scheme, these combinations may reduce diagnostic time.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of fault diagnosis, comprising:
   generating signatures by deterministically partitioning lines of cells of a non-volatile memory array, the lines of cells being either rows or columns of cells of the non-volatile memory array; and
   identifying one or more failing lines of cells based on the signatures.

2. The method recited in claim 1, wherein generating signatures comprises:
   receiving a number x, the number x denoting the number of failing lines of cells in a non-volatile memory array; and
   generating (x+1) groups of partitions such that each partition in a group shares at most one line of cells with other partitions in different groups, the each group of partitions being formed by decomposing lines of cells into a plurality of partitions.

3. The method recited in claim 2, wherein the number x is estimated based on dependent defect density distribution.

4. The method recited in claim 2, wherein the number of the plurality of partitions is $2^n$, where $n=\lceil 0.5 \log_2 v \rceil$ and v is the number of the lines of cells.

5. The method recited in claim 2, wherein generating (x+1) groups of partitions comprises:
   using a selector to implement a formula: $r=S \cdot k+(p \oplus (g \otimes k))$, where r is a line number for a line of cells within partition p of group g, S is the size of a partition, $\oplus$ is a bit-wise addition modulo 2, $g \otimes k$ is a linear feedback shift register (LFSR) state reachable after (k−1) steps following its initialization with the value of g, k=0, 1, . . . , (P−1), and P is the number of partitions within a group.

6. The method recited in claim 5, wherein the selector comprises:
   a partition register and a group register, both registers acting as an extension of an address register of a BIST (built-in self-test) controller, the BIST controller configurable to perform a test to the non-volatile memory array;
   a diffractor, inputs of the diffractor being connected to the group register, outputs of the diffractor being used to selectively invert data arriving from the partition register; and
   an offset register receiving the selectively-inverted data.

7. The method recited in claim 5, wherein generating (x+1) groups of partitions further comprises:
   collecting test responses from a line of cells selected by the selector.

8. The method recited in claim 7, wherein the operation of collecting test responses is executed by a signature register.

9. The method recited in claim 8, wherein the signature register is implemented by a ring generator with multiple inputs.

10. The method recited in claim 1, wherein generating signatures comprises:
    generating a first group of partitions by decomposing lines of cells of the non-volatile memory into a plurality of partitions; and
    generating a plurality of groups of partitions such that each partition in a group shares at most one line of cells with other partitions in different groups including the first group until the number of suspect lines of cells does not decrease any more.

11. The method recited in claim 10, wherein the number of the plurality of partitions is $2^n$, where $n=\lceil 0.5 \log_2 v \rceil$ and v is the number of the lines of cells.

12. A method of fault diagnosis, comprising:
    generating signatures by deterministically partitioning both rows and columns of a non-volatile memory array; and
    identifying one or more faulty cells based on the signatures.

13. The method recited in claim 12, wherein generating signatures comprises:
    receiving a number x and a number y, the number x specifying the number of failing rows and the number y specifying the number of failing columns;
    generating (x+1) groups of row partitions such that each row partition in a group shares at most one row with other row partitions in different groups within the (x+1) groups, and (y+1) groups of column partitions such that each column partition in a group shares at most one column with other column partitions in different groups within the (y+1) groups; each group of row partitions being formed by decomposing rows of a non-volatile memory array into $2^n$ row partitions, where $n=\lceil 0.5 \log_2 R \rceil$ and R is the number of the rows, each group of column partitions being formed by decomposing columns of the non-volatile memory array into $2^m$ column partitions, where $m=0.5 \log_2 C$ and C is the number of the columns.

14. The method recited in claim 13,
wherein generating (x+1) groups of row partitions comprises:
using a row selector to implement a formula: $r = S \cdot k + (p \oplus (g \otimes k))$, where r is a row number for a row in row partition p of group g, S is the size of a row partition, $\oplus$ is a bit-wise addition modulo 2, $g \otimes k$ is a linear feedback shift register (LFSR) state reachable after (k−1) steps following its initialization with the value of g, k=0, 1, . . . , (P−1), and P is the number of row partitions in a group; and
wherein generating (y+1) groups of column partitions comprises:
using a column selector which includes phase shifters for making more than one column of each word be selected at a time.

15. The method recited in claim 14, wherein the row selector and the column selector share partition and group registers.

16. The method recited in claim 14, further comprising:
collecting test responses from cells selected by the row selector and the column selector in the Trellis selection mode and with a device to decrease row-column correlation.

17. The method recited in claim 16, wherein the device to decrease row-column correlation is a simple n-bit arithmetic incrementer.

18. A built-in self-test (BIST) device for a non-volatile memory array, comprising:
means for generating signatures by deterministically partitioning lines of cells of a non-volatile memory array, the lines of cells being either rows or columns of cells of the non-volatile memory array.

19. The BIST device recited in claim 18, wherein the means for generating signatures comprises:
a BIST controller;
a selector selecting test responses generated by the BIST controller, the selector implementing a formula: $r = S \cdot k + (p \oplus (g \otimes k))$, where r is a line number for a line of cells within partition p of group g, S is the size of a partition, $\oplus$ is a bit-wise addition modulo 2, $g \otimes k$ is a linear feedback shift register (LFSR) state reachable after (k−1) steps following its initialization with the value of g, k=0, 1, . . . , (P−1), and P is the number of partitions within a group; and
a signature register collecting test responses selected by the selector.

20. The BIST device recited in claim 19, wherein the selector comprises:
a partition register and a group register, both registers acting as an extension of an address register of a BIST (built-in self-test) controller, the BIST controller configurable to perform a test to the non-volatile memory array;
a diffractor, inputs of the diffractor being connected to the group register, outputs of the diffractor being used to selectively invert data arriving from the partition register; and
an offset register receiving the selectively-inverted data.

21. The BIST device recited in claim 19, wherein the signature register comprises a ring generator with multiple inputs.

22. A built-in self-test (BIST) device for a non-volatile memory array, comprising:
a BIST controller being programmable to execute a test scheme;
a row selector selecting test responses generated by the BIST controller, the row selector implementing a formula: $r = S \cdot k + (p \oplus (g \otimes k))$, where r is a row number for a row in row partition p of group g, S is the size of a row partition, $\oplus$ is a bit-wise addition modulo 2, $g \otimes k$ is a linear feedback shift register (LFSR) state reachable after (k−1) steps following its initialization with the value of g, k=0, 1, . . . , (P−1), and P is the number of row partitions in a group;
a column selector selecting test responses generated by the BIST controller, the column selector including phase shifters for making more than one column of each word be selected at a time; and
a signature register collecting test responses selected by the selector.

23. The BIST device recited in claim 22, wherein the row selector and the column selector share partition and group registers.

\* \* \* \* \*